United States Patent
Wang et al.

(10) Patent No.: US 12,025,653 B2
(45) Date of Patent: Jul. 2, 2024

(54) ARTIFICIAL INTELLIGENCE-BASED CONSTRAINED RANDOM VERIFICATION METHOD FOR DESIGN UNDER TEST AND NON-TRANSITORY MACHINE-READABLE MEDIUM FOR STORING PROGRAM CODE THAT PERFORMS ARTIFICIAL INTELLIGENCE-BASED CONSTRAINED RANDOM VERIFICATION METHOD WHEN EXECUTED

(71) Applicant: MEDIATEK INC., Hsin-Chu (TW)

(72) Inventors: Chung-An Wang, Hsinchu (TW); Chiao-Hua Tseng, Hsinchu (TW); Chia-Cheng Tsai, Hsinchu (TW); Tung-Yu Lee, Hsinchu (TW); Yen-Her Chen, Hsinchu (TW); Chien-Hsin Yeh, Hsinchu (TW); Chia-Shun Yeh, Hsinchu (TW); Chin-Tang Lai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/968,798

(22) Filed: Oct. 19, 2022

(65) Prior Publication Data
US 2023/0144389 A1 May 11, 2023

Related U.S. Application Data

(60) Provisional application No. 63/278,118, filed on Nov. 11, 2021.

(51) Int. Cl.
*G01R 31/28* (2006.01)

(52) U.S. Cl.
CPC ..... *G01R 31/2837* (2013.01); *G01R 31/2841* (2013.01)

(58) Field of Classification Search
CPC .............. G01R 31/2837; G01R 31/2841
See application file for complete search history.

(56) References Cited

U.S. PATENT DOCUMENTS

| | | | |
|---|---|---|---|
| 2009/0164861 A1 | 6/2009 | Tseng | |
| 2013/0318486 A1 | 11/2013 | Sasaki | |
| 2018/0218102 A1 | 8/2018 | Ledzius | |
| 2023/0376645 A1* | 11/2023 | Shojaei | G06F 30/17 |

OTHER PUBLICATIONS

Pfeifer et al., A Reinforcement Learning Approach to Directed Test Generation for Shared Memory Verification, Jun. 15, 2020, p. 538-543, IEEE.

(Continued)

*Primary Examiner* — Rahel Guarino
(74) *Attorney, Agent, or Firm* — Winston Hsu (57) ABSTRACT

An artificial intelligence (AI)-based constrained random verification (CRV) method for a design under test (DUT) includes: receiving a series of constraints; obtaining a limited constraint range according to the series of constraints; generating a series of stimuli according to the limited constraint range; and verifying the DUT by the series of stimuli; wherein at least one of the step of obtaining the limited constraint range according to the series of constraints and the step of generating the series of stimuli according to the limited constraint range employs an AI algorithm.

24 Claims, 7 Drawing Sheets

(56) References Cited

OTHER PUBLICATIONS

Wang et al., Accelerating Coverage Directed Test Generation for Functional Verification: A Neural Network-based Framework, May 2018, p. 1-6, GLSVLSI '18: Proceedings of the 2018 on Great Lakes Symposium on VLSI.
Gogri et al., Machine Learning-Guided Stimulus Generation for Functional Verification, 2020, p. 1-10, 2020 DVCON.
Roy et al., Dynamically Optimized Test Generation Using Machine Learning, 2021, p. 1-6, 2021 DVCON.

* cited by examiner

ARTIFICIAL INTELLIGENCE-BASED CONSTRAINED RANDOM VERIFICATION METHOD FOR DESIGN UNDER TEST AND NON-TRANSITORY MACHINE-READABLE MEDIUM FOR STORING PROGRAM CODE THAT PERFORMS ARTIFICIAL INTELLIGENCE-BASED CONSTRAINED RANDOM VERIFICATION METHOD WHEN EXECUTED

CROSS REFERENCE TO RELATED APPLICATIONS

This application claims the benefit of U.S. Provisional Application No. 63/278,118, filed on Nov. 11, 2021. The content of the application is incorporated herein by reference.

BACKGROUND

The present invention relates to constrained random verification (CRV), and more particularly, to an artificial intelligence (AI)-based CRV method and a non-transitory machine-readable medium for storing a program code that performs the AI-based CRV method when executed.

The CRV is a simulation-based method for register transfer level (RTL) design verification, and is arranged to generate multiple stimuli according to multiple constraints to interact with a design under test (DUT), wherein the multiple stimuli is arranged to verify performance of the DUT in a testbench. As the design becomes more and more complex, the stimulus space of the CRV becomes larger. The CRV will be harder to generate specific stimuli to hit a corner case. Hence, the coverage closure becomes a challenging problem for design verification engineers and requires a lot of laborious human effort to complete. Take a memory management unit (MMU) with at least one first in first out (FIFO) as an example. The corner case can be to verify whether a functional operation is working or not when the at least one FIFO in the MMU is full. The problem is how to determine a sequence of constraints to trigger PUSH behaviors of the at least one FIFO as possible as it could to fill up the at least one FIFO. As a result, a novel framework for the CRV to increase a hit rate of the corner case in design verification without human expert guidance is urgently needed.

SUMMARY

It is therefore one of the objectives of the present invention to provide an AI-based CRV method and a non-transitory machine-readable medium for storing a program code that provides the AI-based CRV method when executed, to address the above-mentioned issues.

According to an embodiment of the present invention, an AI-based CRV method for a DUT is provided. The AI-based CRV method includes: receiving a series of constraints; obtaining a limited constraint range according to the series of constraints; generating a series of stimuli according to the limited constraint range; and verifying the DUT by the series of stimuli; wherein at least one of the step of obtaining the limited constraint range according to the series of constraints and the step of generating the series of stimuli according to the limited constraint range employs an AI algorithm.

According to an embodiment of the present invention, a non-transitory machine-readable medium for storing a program code is provided, wherein when loaded and executed by a processor, the program code instructs the processor to perform an AI-based CRV method for a DUT, and the AI-based CRV method includes: receiving a series of constraints; obtaining a limited constraint range according to the series of constraints; generating a series of stimuli according to the limited constraint range; and verifying the DUT by the series of stimuli; wherein at least one of the step of obtaining the limited constraint range according to the series of constraints and the step of generating the series of stimuli according to the limited constraint range employs an AI algorithm.

One of the benefits of the present invention is that, by the two-stage framework combined with the CRV of the present invention, the hit rate of the corner case for the DUT in the design verification can be increased, which can greatly improve the verification quality and shorten the time-to-market. In addition, in some embodiments, the two-stage framework of the present invention can be modified to only include the constraint selected stage or only include the stimuli generated stage, which can also increase the hit rate of the corner case for the DUT in the design verification.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ".

Figure 1:
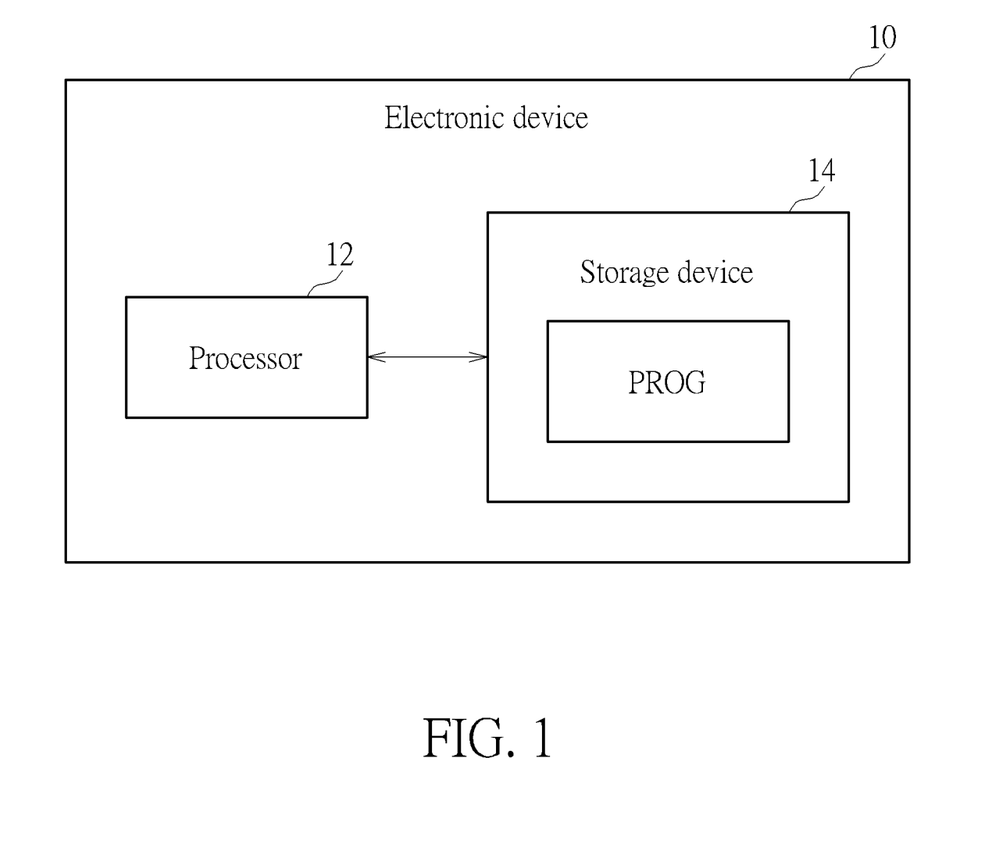
FIG. 1 is a diagram illustrating an electronic device according to an embodiment of the present invention.

FIG. 1 is a diagram illustrating an electronic device 10 according to an embodiment of the present invention. By way of example, but not limitation, the electronic device 10 may be a portable device such as a smartphone or a tablet. The electronic device 10 may include a processor 12 and a storage device 14. The processor 12 may be a single-core processor or a multi-core processor. The storage device 14 is a non-transitory machine-readable medium, and is arranged to store computer program code PROG, multiple models (e.g. a selector and a generator), and a series of constraints CONS for the constrained random verification (CRV). The processor 12 is equipped with software execution capability. The computer program code PROG may include multiple artificial intelligence (AI)-based algorithms (e.g. a transformer-based algorithm and a reinforcement learning (RL)-based algorithm). When loaded and executed by the processor 12, the computer program code PROG instructs the processor 12 to train the selector according to the transformer-based algorithm and/or train the generator according to the RL-based algorithm. The electronic device 10 may be regarded as a computer system using a computer program product that includes a computer-readable medium containing the computer program code PROG. Regarding an AI-based CRV method for a design under test (DUT) as proposed by the present invention, it may be embodied on the electronic device 10.

Figure 2:
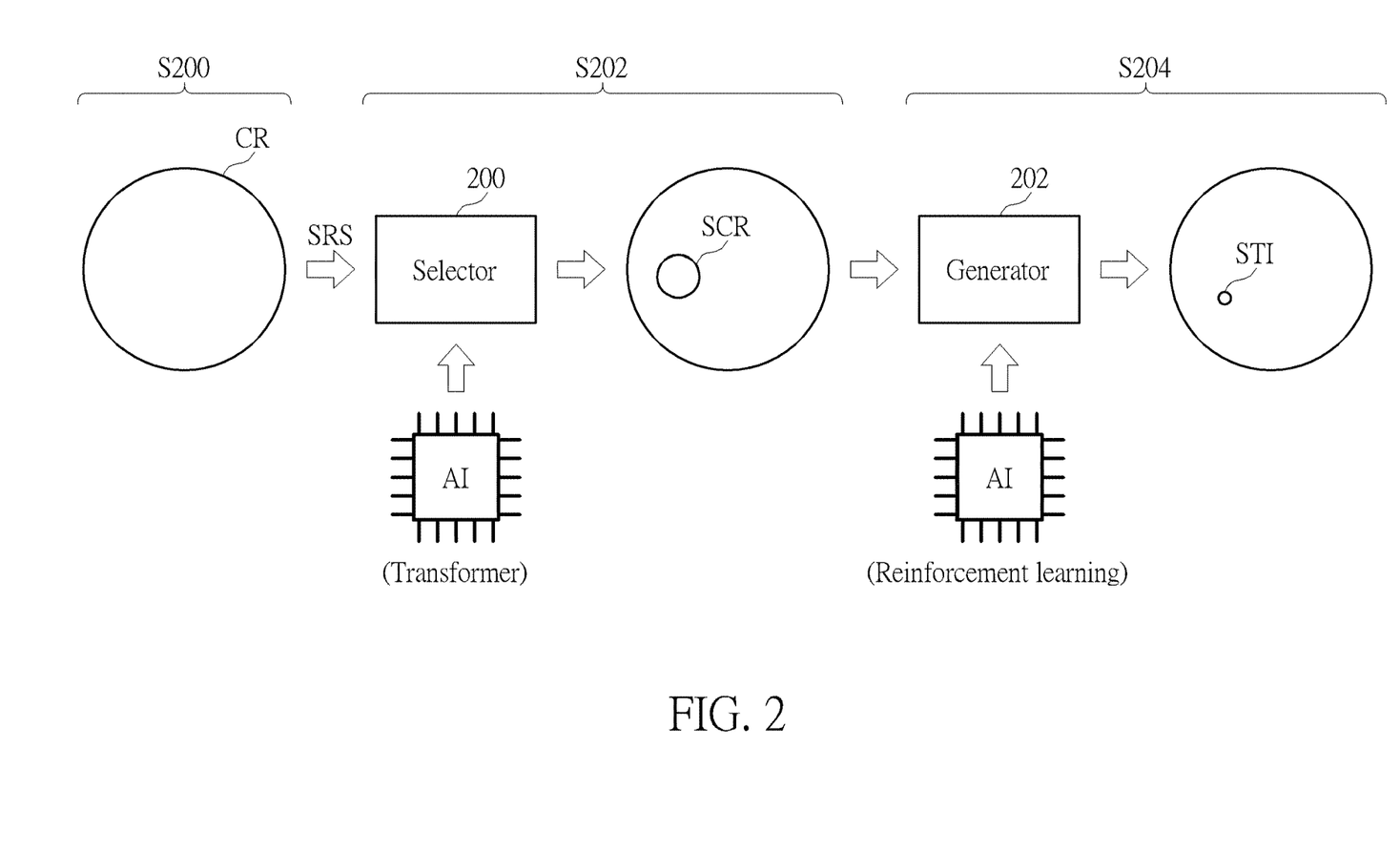
FIG. 2 is a flow chart of an artificial intelligence (AI)-based constrained random verification (CRV) method according to an embodiment of the present invention.

Please refer to FIG. 2. FIG. 2 is a flow chart of an AI-based CRV method according to an embodiment of the present invention, wherein the concept of CRV and the concept of machine learning are combined in the AI-based CRV method for increasing a hit rate of a corner case in design verification of a DUT without human expert guidance. For example, the DUT may be a memory management unit (MMU) with at least one first in first out (FIFO), and the corner case may be to verify whether a functional operation is working or not when the at least one FIFO in the MMU is full, but the present invention is not limited thereto. The AI-based CRV method of the present invention can also be applied to other product verification according to design requirements. In some embodiments of the present invention, the computer program code PROG instructs the processor 12 to perform the AI-based CRV method when loaded and executed by the processor 12.

In Step S200, the series of constraints CONS that are arranged to determine a stimulus space may be stored in the storage device 14. For example, a series of virtual addresses that are transmitted to an MMU may be arranged to trigger PUSH behaviors or POP behaviors of the at least one FIFO in the MMU, and may be regarded as the series of constraints CONS. It is assumed that the length of the series of constraints CONS is 30, and for each element in the series of constraints CONS, one of 16 constrained parameters (e.g. 0-15) may be selected to represent the amount of adjustment between the corresponding virtual address and the previous virtual address. As a result, the stimulus space for the series of constraints CONS may be $16^{30}$.

In Step S202, a range of the series of constraints CONS (labeled as "CR" in FIG. 2) is refactored in ascending order to obtain multiple sub-ranges SRS, a selector 200 is trained according to a transformer-based algorithm and the multiple sub-ranges SRS, and a selected constraint range SCR is selected from the multiple sub-ranges SRS by the selector. For example, since the more the PUSH behaviors of the at least one FIFO are triggered, the easier it is to make the FIFO full, one of the multiple sub-ranges SRS with the highest number of PUSH counts is selected from the multiple sub-ranges SRS as the selected constraint range SCR by the selector 200. It is assumed that a specific range (e.g. 2-5) is selected as the selected constraint range SCR, the stimulus space for the selected constraint range SCR may be $4^{30}$, which is much smaller than that for the series of constraints CONS (e.g. $16^{30}$).

In Step S204, a generator 202 is trained according to an RL-based algorithm and the selected constraint range SCR, to generate a series of stimuli STI, wherein the hit rate of the corner case of the DUT is increased through the series of stimuli STI.

Figure 3:
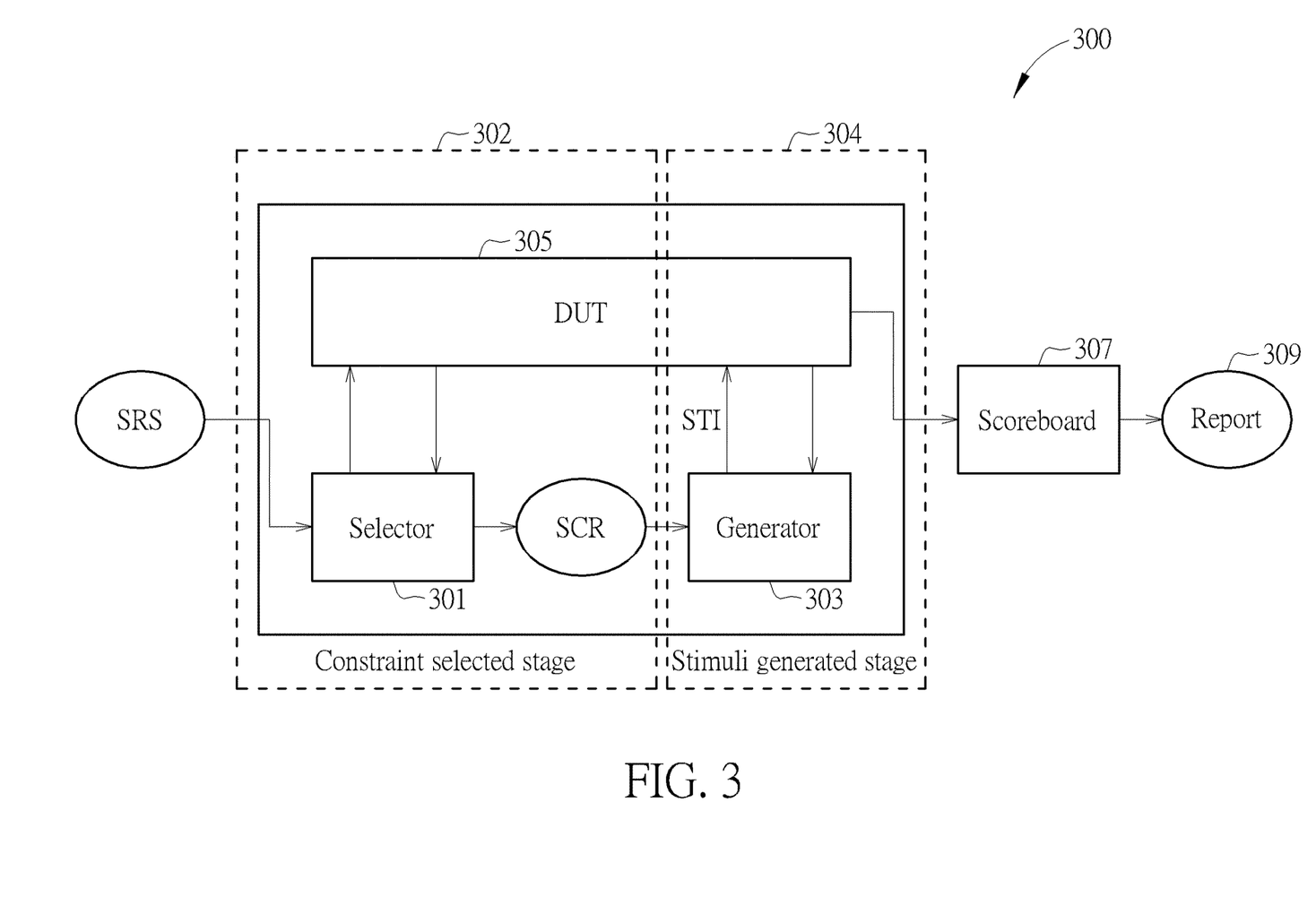
FIG. 3 is a diagram illustrating a two-stage framework for the CRV according to an embodiment of the present invention.

In detail, please refer to FIG. 3. FIG. 3 is a diagram illustrating a two-stage framework 300 for the CRV according to an embodiment of the present invention, wherein the two-stage framework 300 is designed to replace manual tuning of constraints and random generation of stimuli in CRV. The two-stage framework 300 may include a constraint selected stage 302 and a stimuli generated stage 304, the Step S202 shown in FIG. 2 may be implemented by a selector 301 in the constraint selected stage 302, and the Step S204 shown in FIG. 2 may be implemented by a generator 303 in the stimuli generated stage 304.

In the constraint selected stage 302, simulations between a DUT 305 (e.g. an MMU with at least one FIFO) and one of the multiple sub-ranges SRS are performed to obtain a target value. For example, the target value may be a number of PUSH counts of the at least one FIFO in the MMU. The selector 301 may be trained according to said one of the multiple sub-ranges SRS and the target value through the transformer-based algorithm. After the selector 301 fits said one of the multiple sub-ranges SRS, target values of others of the multiple sub-ranges SRS may be predicted according to the selector 301. In this way, the selector 301 can learn patterns between the multiple sub-ranges SRS and select one of the multiple sub-ranges SRS that can trigger the highest number of PUSH counts as the selected constraint range SCR. Under a condition that an original range set of the series of constraints CONS is a range set $\{0, 1, 2, \ldots, M-1\}$, the selected constraint range SCR may be a range set $\{m_1, m_{1+1}, \ldots, m_2-1\}$, wherein M is a positive integer (i.e. $M \geq 1$), $m_1$ is an integer (i.e. $m_1 \geq 0$), and $m_2$ is smaller than or equal to M (i.e. $m_2 \leq M$).

Figure 4:
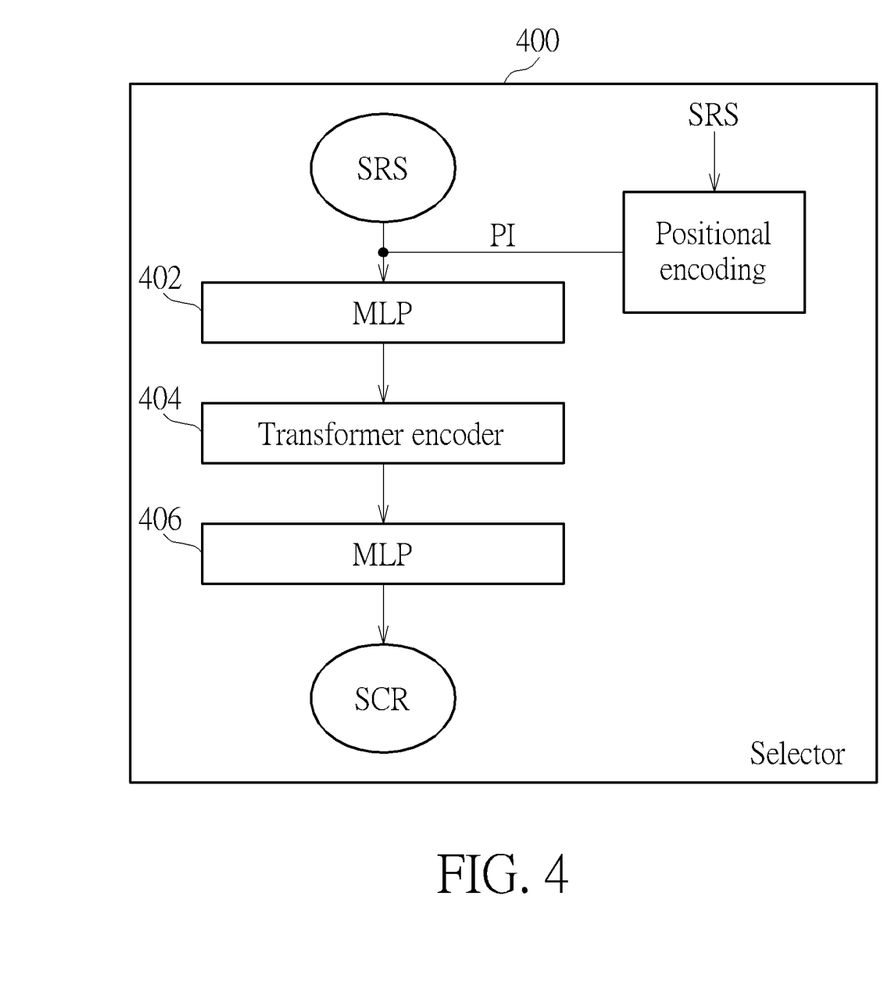
FIG. 4 is a diagram illustrating a selector according to an embodiment of the present invention.

In detail, please refer to FIG. 4. FIG. 4 is a diagram illustrating a selector 400 according to an embodiment of the present invention, wherein the selector 301 shown in FIG. 3 may be implemented by the selector 400. As shown in FIG. 4, a structure of the selector 400 may include a multilayer perceptron (MLP) 402, a transformer encoder 404, and an MLP 406. In the beginning, since all of the multiple sub-ranges SRS are in ascending order, a positional encoding is performed upon the multiple sub-ranges SRS, to obtain position information PI for subsequent process. Regarding the transformer encoder 404, the transformer encoder 404 is an encoder in a transformer model, and a self-attention mechanism of the transformer encoder 404 is utilized to build the selector 400 for automatically selecting the selected constraint range SCR. Finally, the output of the transformer encoder 404 is transmitted to the MLP 406 for predicting the target values of others of the multiple sub-ranges SRS. In this way, the selector 400 may be arranged to select the selected constraint range SCR from the multiple sub-ranges SRS, and transmit the selected constraint range SCR to the generator 303 in the stimuli generated stage 304.

Figure 5:
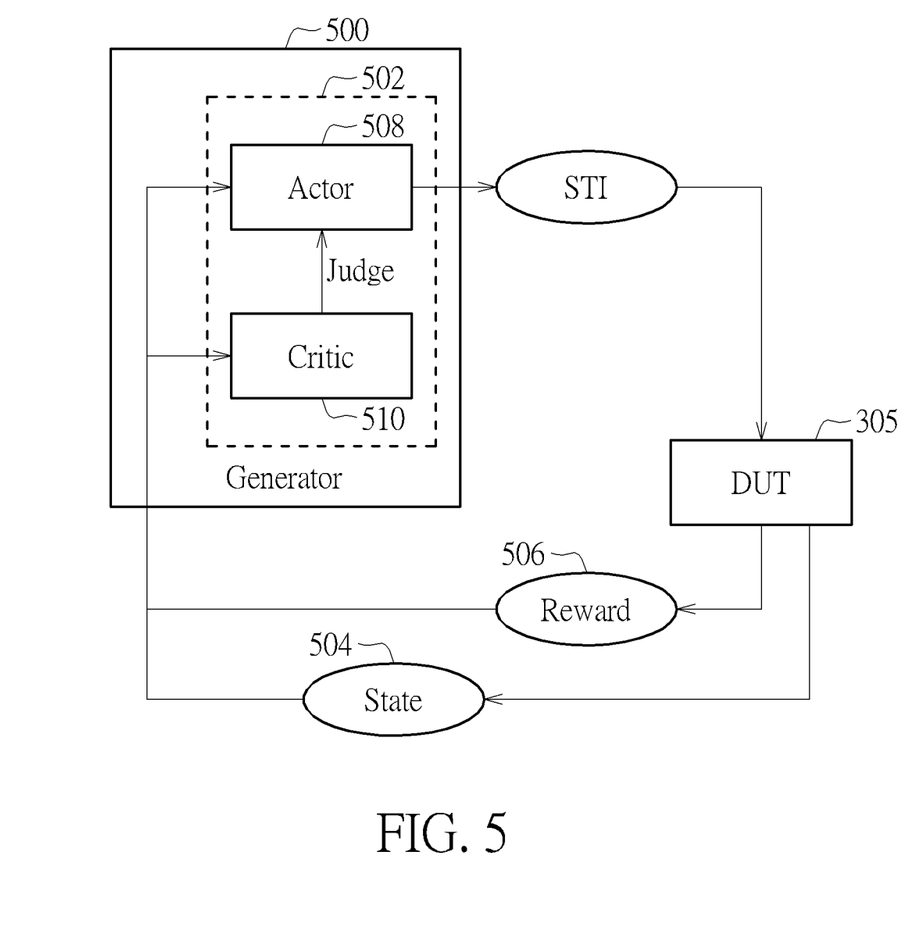
FIG. 5 is a diagram illustrating a generator according to an embodiment of the present invention.

Please refer back to FIG. 3. In the stimuli generated stage 304, after receiving the selected constraint range SCR from the selector 301/400, the generator 303 may learn to generate the series of stimuli STI according to the selected constraint range SCR through the RL-based algorithm, to achieve the corner case of the DUT 305 (e.g. fill up the at least one FIFO of the MMU). In detail, please refer to FIG. 5. FIG. 5 is a diagram illustrating a generator 500 according to an embodiment of the present invention, the generator 303 shown in FIG. 3 may be implemented by the generator 500. As shown in FIG. 5, the generator 500 and the DUT 305 may act as an agent and an environment for RL, respectively. For each constraint in the selected constraint range SCR, the generator 500 may interact with the DUT 305 to obtain a target value (e.g. a number of PUSH counts) as a reward 506 for RL. The generator 500 may be trained according to an action 502, a state 504, and the reward 506 through the RL-based algorithm (i.e. the generator 500 may generate the action 502 to interact with the DUT 305, and the DUT 305 may return the state 504 and the reward 506 back to the generator 500), and may learn how to generate an action with the maximum reward.

Regarding the action 502, under a condition that the length of the series of stimuli STI is N and the length of the selected constraint range SCR is T, N cycles are required to be executed for the series of stimuli STI. For each cycle, the generator 500 may select a constraint from the selected constraint range SCR to generate a stimulus for interacting with the DUT 305. As a result, the action space for the selected constraint range SCR may be TN. Under a condition that an original range set of the series of constraints CONS is a range set $\{0, 1, 2, \ldots, M-1\}$, the selected constraint range SCR may be a range set $\{m_1, m_{1+1}, \ldots, m_2-1\}$, the original action space may be $M^N$, and the action space corresponding to the selected constraint range SCR may be $(m_2-m_1)^N$, wherein M is a positive integer (i.e. $M \geq 1$), $m_1$ is an integer (i.e. $m_1 \geq 0$), $m_2$ is smaller than or equal to M (i.e. $m_2 \leq M$), and the action space corresponding to the selected constraint range SCR may be reduced to be smaller than the original action space. In addition, an actor-critic method is applied to the generator 500. As shown in FIG. 5, the generator 500 may include an actor model 508 and a critic model 510, wherein the actor model 508 may be arranged to predict action of N cycles every iteration, the critic model 510 may be arranged to judge every action predicted by the actor model 508, and a proximal policy optimization principle (PPO2) is utilized as an objective function to optimize the actor model 508 and the critic model 510.

Regarding the state 504, the initial state may be encoded as a list of 0 with the same length of the series of stimuli STI. For each cycle, the state 504 will be updated to the collection of the previous actions. Since operations of the RL through the action 502, the state 504, and the reward 506 are well known to those skilled in the art, the details of the RL will not be described in the specification of the present invention.

After the series of stimuli STI are generated by the generator 303, a scoreboard 307 may be arranged to verify the functionality of the DUT 305 according to the series of stimuli STI, to generate a report 309, wherein the hit rate of the corner case of the DUT 305 is increased through the series of stimuli STI. Since operations of the CRV are well known to those skilled in the art, the details of the CRV will not be described in the specification of the present invention.

Figure 6:
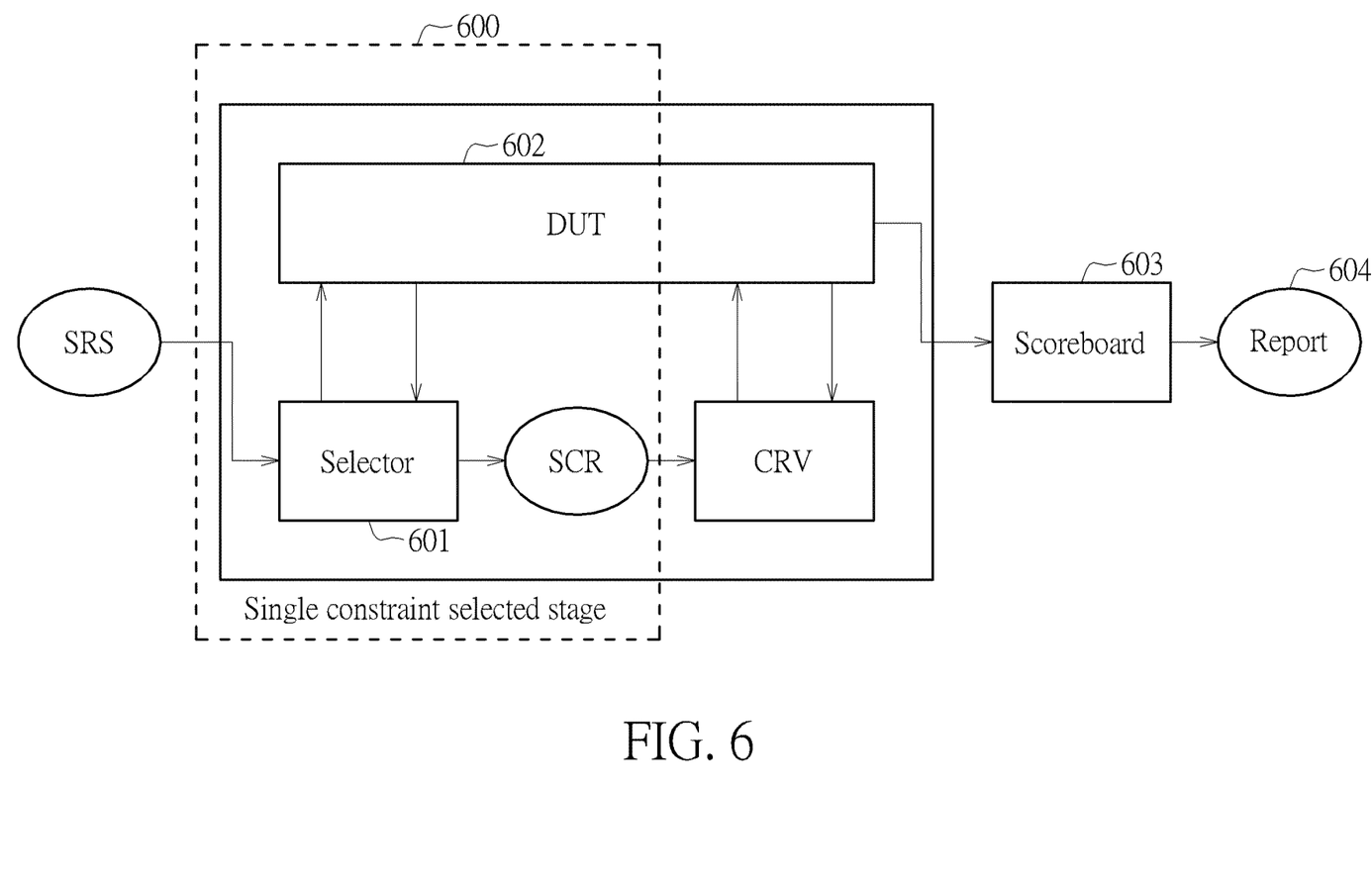
FIG. 6 is a diagram illustrating a single constraint selected stage for the CRV according to an embodiment of the present invention.

It should be noted that, in some embodiments, a single constraint selected stage (e.g. the constraint selected stage 302) combined with the CRV can also increase the hit rate of the corner case for the DUT. That is, the two-stage framework 300 shown in FIG. 3 can be modified to only include the constraint selected stage 302. Please refer to FIG. 6. FIG. 6 is a diagram illustrating a single constraint selected stage 600 for the CRV according to an embodiment of the present invention. As mentioned above, in the single constraint selected stage 600, a selector 601 is trained according to the transformer-based algorithm and the multiple sub-ranges SRS, and the selected constraint range SCR is selected from the multiple sub-ranges SRS by the selector 601. Afterwards, the CRV method is utilized for further simulations toward a DUT 602, to generate multiple stimuli, wherein the hit rate of the corner case for the DUT 602 can also be increased through the multiple stimuli. After the series of stimuli STI are generated by the CRV, a scoreboard 603 may be arranged to verify the functionality of the DUT 602 according to the series of stimuli STI, to generate a report 604. For brevity, similar descriptions for these embodiments are omitted here.

Figure 7:
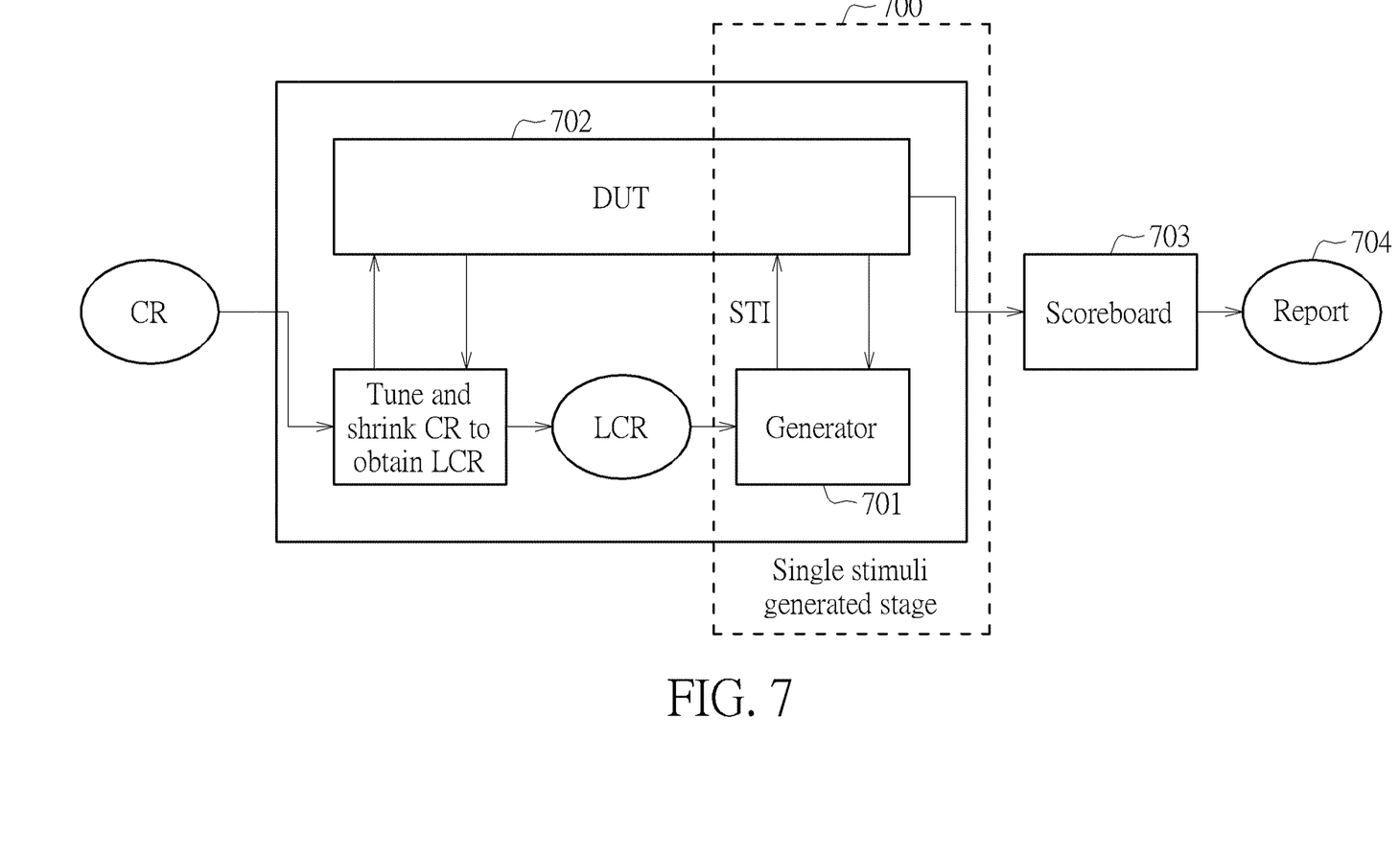
FIG. 7 is a diagram illustrating a single stimuli generated stage for the CRV according to an embodiment of the present invention.

In addition, in some embodiments, a single stimuli generated stage (e.g. the stimuli generated stage 304) can also increase the hit rate of the corner case for the DUT. That is, the two-stage framework 300 shown in FIG. 3 can be modified to only include the stimuli generated stage 304. Please refer to FIG. 7. FIG. 7 is a diagram illustrating a single stimuli generated stage 700 for the CRV according to an embodiment of the present invention. In the beginning, the range of the series of constraints CONS (labeled as "CR" in FIG. 7) stored in the storage device 14 can be tuned and shrunk to obtain a limited constraint range LCR, wherein the limited constraint range LCR may be transmitted to a generator 701 in the single stimuli generated stage 700. Afterwards, the generator 701 may learn to generate the series of stimuli STI according to the limited constraint range LCR through the RL-based algorithm, to achieve the corner case of a DUT 702 (e.g. fill up the at least one FIFO of the MMU). In this way, the hit rate of the corner case for the DUT 702 can also be increased through the series of stimuli STI. After the series of stimuli STI are generated by the generator 701, a scoreboard 703 may be arranged to verify the functionality of the DUT 702 according to the series of stimuli STI, to generate a report 704. For brevity, similar descriptions for these embodiments are omitted here.

In summary, by the two-stage framework 300 combined with the CRV of the present invention, the hit rate of the corner case for the DUT in the design verification can be increased, which can greatly improve the verification quality and shorten the time-to-market. In addition, in some embodiments, the two-stage framework 300 of the present invention can be modified to only include the constraint selected stage 302 or only include the stimuli generated stage 304, which can also increase the hit rate of the corner case for the DUT in the design verification.

Those skilled in the art will readily observe that numerous modifications and alterations of the device and method may be made while retaining the teachings of the invention. Accordingly, the above disclosure should be construed as limited only by the metes and bounds of the appended claims

What is claimed is:

1. An artificial intelligence (AI)-based constrained random verification (CRV) method for a design under test (DUT), comprising:
   receiving a series of constraints;
   obtaining a limited constraint range according to the series of constraints;
   generating a series of stimuli according to the limited constraint range; and
   verifying the DUT by the series of stimuli;
   wherein at least one of the step of obtaining the limited constraint range according to the series of constraints and the step of generating the series of stimuli according to the limited constraint range employs an AI algorithm.

2. The AI-based CRV method of claim 1, wherein a hit rate of a corner case of the DUT is increased through the series of stimuli.

3. The AI-based CRV method of claim 1, wherein both of the step of obtaining the limited constraint range according to the series of constraints and the step of generating the series of stimuli according to the limited constraint range employ the AI algorithm; the step of obtaining the limited constraint range according to the series of constraints further comprises:
- refactoring a range of the series of constraints to obtain multiple sub-ranges;
- training a first model according to a first AI algorithm and the multiple sub-ranges; and
- selecting a selected constraint range from the multiple sub-ranges as the limited constraint range by the first model;

wherein the step of generating the series of stimuli according to the limited constraint range further comprises:
- training a second model according to a second AI algorithm and the selected constraint range, to generate the series of stimuli.

4. The AI-based CRV method of claim 3, wherein the first AI algorithm is a transformer-based algorithm, and the second AI algorithm is a reinforcement learning (RL)-based algorithm.

5. The AI-based CRV method of claim 4, wherein the step of training the first model according to the first AI algorithm and the multiple sub-ranges comprises:
- performing simulations between the DUT and one of the multiple sub-ranges, to obtain a target value;
- training the first model according to said one of the multiple sub-ranges and the target value; and
- predicting target values of others of the multiple sub-ranges according to the first model;
- wherein the selected constraint range is selected from the multiple sub-ranges according to target values of the multiple sub-ranges.

6. The AI-based CRV method of claim 4, wherein the step of selecting the selected constraint range from the multiple sub-ranges as the limited constraint range by the first model comprises:
- utilizing a self-attention mechanism of an encoder in a transformer model to automatically select the selected constraint range from the multiple sub-ranges.

7. The AI-based CRV method of claim 4, wherein the second model and the DUT act as an agent and an environment for RL, respectively; and for each constraint in the selected constraint range, the second model interacts with the DUT to obtain a target value as a reward for RL.

8. The AI-based CRV method of claim 1, wherein the step of obtaining the limited constraint range according to the series of constraints employs the AI algorithm, and further comprises:
- refactoring a range of the series of constraints to obtain multiple sub-ranges;
- training a model according to a transformer-based algorithm and the multiple sub-ranges; and
- selecting the selected constraint range from the multiple sub-ranges as the limited constraint range by the model.

9. The AI-based CRV method of claim 8, wherein the step of training the model according to the transformer-based algorithm and the multiple sub-ranges comprises:
- performing simulations between the DUT and one of the multiple sub-ranges, to obtain a target value;
- training the model according to said one of the multiple sub-ranges and the target value; and
- predicting target values of others of the multiple sub-ranges according to the model;
- wherein the selected constraint range is selected from the multiple sub-ranges according to target values of the multiple sub-ranges.

10. The AI-based CRV method of claim 8, wherein the step of selecting the selected constraint range from the multiple sub-ranges as the limited constraint range by the model comprises:
- utilizing a self-attention mechanism of an encoder in a transformer model to automatically select the selected constraint range from the multiple sub-ranges.

11. The AI-based CRV method of claim 1, wherein the step of generating the series of stimuli according to the limited constraint range employs the AI algorithm, and further comprises:
- training a model according to a reinforcement learning (RL)-based algorithm and the limited constraint range, to generate the series of stimuli.

12. The AI-based CRV method of claim 11, wherein the model and the DUT act as an agent and an environment for RL, respectively; and for each constraint in the limited constraint range, the model interacts with the DUT to obtain a target value as a reward for RL.

13. A non-transitory machine-readable medium for storing a program code, wherein when loaded and executed by a processor, the program code instructs the processor to perform an artificial intelligence (AI)-based constrained random verification (CRV) method for a design under test (DUT), and the AI-based CRV method comprises:
- receiving a series of constraints;
- obtaining a limited constraint range according to the series of constraints;
- generating a series of stimuli according to the limited constraint range; and
- verifying the DUT by the series of stimuli;
- wherein at least one of the step of obtaining the limited constraint range according to the series of constraints and the step of generating the series of stimuli according to the limited constraint range employs an AI algorithm.

14. The non-transitory machine-readable medium of claim 13, wherein a hit rate of a corner case of the DUT is increased through the series of stimuli.

15. The non-transitory machine-readable medium of claim 13, wherein both of the step of obtaining the limited constraint range according to the series of constraints and the step of generating the series of stimuli according to the limited constraint range employ the AI algorithm; the step of obtaining the limited constraint range according to the series of constraints further comprises:
- refactoring a range of the series of constraints to obtain multiple sub-ranges;
- training a first model according to a first AI algorithm and the multiple sub-ranges; and
- selecting a selected constraint range from the multiple sub-ranges as the limited constraint range by the first model;

wherein the step of generating the series of stimuli according to the limited constraint range further comprises:
- training a second model according to a second AI algorithm and the selected constraint range, to generate the series of stimuli.

16. The non-transitory machine-readable medium of claim 15, wherein the first AI algorithm is a transformer-based algorithm, and the second AI algorithm is a reinforcement learning (RL)-based algorithm.

17. The non-transitory machine-readable medium of claim 16, wherein the step of training the first model according to the first AI algorithm and the multiple sub-ranges comprises:

performing simulations between the DUT and one of the multiple sub-ranges, to obtain a target value;

training the first model according to said one of the multiple sub-ranges and the target value; and predicting target values of others of the multiple sub-ranges according to the first model;

wherein the selected constraint range is selected from the multiple sub-ranges according to target values of the multiple sub-ranges.

18. The non-transitory machine-readable medium of claim 16, wherein the step of selecting the selected constraint range from the multiple sub-ranges as the limited constraint range by the first model comprises:

utilizing a self-attention mechanism of an encoder in a transformer model to automatically select the selected constraint range from the multiple sub-ranges.

19. The non-transitory machine-readable medium of claim 16, wherein the second model and the DUT act as an agent and an environment for RL, respectively; and for each constraint in the selected constraint range, the second model interacts with the DUT to obtain a target value as a reward for RL.

20. The non-transitory machine-readable medium of claim 13, wherein the step of obtaining the limited constraint range according to the series of constraints employs the AI algorithm, and further comprises:

refactoring a range of the series of constraints to obtain multiple sub-ranges;

training a model according to a transformer-based algorithm and the multiple sub-ranges; and selecting a selected constraint range from the multiple sub-ranges as the limited constraint range by the model.

21. The non-transitory machine-readable medium of claim 20, wherein the step of training the model according to the transformer-based algorithm and the multiple sub-ranges comprises:

performing simulations between the DUT and one of the multiple sub-ranges, to obtain a target value;

training the model according to said one of the multiple sub-ranges and the target value; and predicting target values of others of the multiple sub-ranges according to the model;

wherein the selected constraint range is selected from the multiple sub-ranges according to target values of the multiple sub-ranges.

22. The non-transitory machine-readable medium of claim 20, wherein the step of selecting the selected constraint range from the multiple sub-ranges as the limited constraint range by the model comprises:

utilizing a self-attention mechanism of an encoder in a transformer model to automatically select the selected constraint range from the multiple sub-ranges.

23. The non-transitory machine-readable medium of claim 13, wherein the step of generating the series of stimuli according to the limited constraint range employs the AI algorithm, and further comprises:

training a model according to a reinforcement learning (RL)-based algorithm and the limited constraint range, to generate the series of stimuli.

24. The non-transitory machine-readable medium of claim 23, wherein the model and the DUT act as an agent and an environment for RL, respectively; and for each constraint in the limited constraint range, the model interacts with the DUT to obtain a target value as a reward for RL.

* * * * *